(12) United States Patent
Chen et al.

(10) Patent No.: US 7,091,098 B2
(45) Date of Patent: Aug. 15, 2006

(54) SEMICONDUCTOR DEVICE WITH SPACER HAVING BATCH AND NON-BATCH LAYERS

(75) Inventors: Yen Ming Chen, Hsin-Chu (TW); Lin Jun Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 10/819,681

(22) Filed: Apr. 7, 2004

(65) Prior Publication Data

US 2005/0227468 A1 Oct. 13, 2005

(51) Int. Cl.
*H01L 21/336* (2006.01)
*H01L 29/76* (2006.01)

(52) U.S. Cl. .................. 438/305; 438/303; 438/587; 438/695; 438/184; 438/230; 438/197; 257/288; 257/355

(58) Field of Classification Search ............... 438/305, 438/303, 587, 695, 184, 230, 197; 257/288, 257/355
See application file for complete search history.

(56) References Cited

U.S. PATENT DOCUMENTS

| | | | |
|---|---|---|---|
| 4,868,617 A | 9/1989 | Chiao et al. | |
| 5,061,647 A | 10/1991 | Roth et al. | |
| 5,210,435 A | 5/1993 | Roth et al. | |
| 5,264,380 A | 11/1993 | Pfiester | |
| 5,872,030 A | 2/1999 | Huang | |
| 6,198,173 B1 | 3/2001 | Huang | |
| 6,235,600 B1 | 5/2001 | Chiang et al. | |
| 6,452,232 B1 | 9/2002 | Adan | |
| 6,468,851 B1 | 10/2002 | Ang et al. | |
| 6,828,160 B1* | 12/2004 | Liu | 438/3 |
| 2002/0132397 A1* | 9/2002 | Weimer et al. | 438/151 |
| 2003/0189231 A1* | 10/2003 | Clevenger et al. | 257/355 |
| 2004/0203211 A1* | 10/2004 | Yang et al. | 438/299 |
| 2005/0133835 A1* | 6/2005 | Bu et al. | 257/288 |
| 2005/0173729 A1* | 8/2005 | Frey et al. | 257/194 |

OTHER PUBLICATIONS

Chang, Leland, et al., "MOSFET Scaling into the 10nm Regime", University of California, Berkely, CA, 2 pages.
Chang, Leland, et al., "MOSFET Scaling into the 10 nm Regime", Superlattices and Microstructures, vol. 28, No. 5/6, 2000 Academic Press, pp. 351-355.
Jiang, H.W., et al., "Gate-Controlled Electron Spin Resonance in $GaAs/Al_2Ga_{1-z}As$ Heterostructures", Physical Review B, vol. 64, 2001 The American Physical Society, pp. 041307-1-014307-4.
Kalra, Ekta, et la., "Scaling Effects on Thermal and Gate Induced Noise of Small Geometry LDD Mosfets", Academic Open Internet Journal, www.acadjournal.com/2000/v1/part1/p1/aoli_kalra.pdf, 2000, 8 pages.

(Continued)

*Primary Examiner*—Asok K. Sarkar
*Assistant Examiner*—Victor V. Yevsikov
(74) *Attorney, Agent, or Firm*—Haynes and Boone, LLP

(57) ABSTRACT

A semiconductor device including a gate stack located over a substrate and a spacer located over the substrate and adjacent the gate stack. The spacer includes a plurality of layers, wherein at least one of the plurality of layers is a batch layer and at least one of the plurality of layers is a non-batch layer.

21 Claims, 4 Drawing Sheets

OTHER PUBLICATIONS

Lim, K.Y., et al., "A Physically-Based Semi-Empirical Series Resistance Model for Deep-Submicron MOSFET I-V Modeling", IEEE Transactions on Electron Devices, vol. 47, No. 6, Jun. 2000, IEEE, pp. 1300-1302.

Zeghbroeck, Van, "Chapter 7: MOS Field-Effect-Transistors/7:4 Threshold Voltage", http://ece-www.Colorado.edu/-bart/book/book/chapter7/ch7_4.htm, printed on Apr. 9, 2003, 4 pages.

Zeghbroeck, Van, "Chapter 7: MOS Field-Effect-Transistors/7:5 MOSFET Spice Model", http://ece-www.Colorado.edu/-bart/book/book/chapter7/ch7_5.htm, printed on Apr. 9, 2003, 2 pages.

http://www.iue.tuwien.ac.al/publications/PhD%20Theses/schrom/node83.html, "A 1.2 The Concrete MOSFET (1): Long-Channel Transistors", printed on Apr. 9, 2003, 2 pages.

* cited by examiner

SEMICONDUCTOR DEVICE WITH SPACER HAVING BATCH AND NON-BATCH LAYERS

BACKGROUND

The present disclosure relates generally to semiconductor devices and, more specifically, to a semiconductor device comprising a spacer having at least one batch layer and at least one non-batch layer.

The present disclosure is related to U.S. patent Ser. No. 10/614,388, which is assigned to the same assignee as the present invention, and which is hereby incorporated by reference.

The relentless demands for increased performance, decreased size and reduced manufacturing costs of semiconductor devices has increased the number of individual processes collectively performed during the fabrication of a "batch" or group of wafers. It is reported that a decrease in a characteristic dimension of a semiconductor device feature is accompanied by a proportional increase in the number of steps required to completely form the device. For example, the recent decrease of semiconductor device gate widths from 0.25 µm to 0.13 µm required a substantially proportional increase in fabrication steps from about 240 steps to about 360 steps. Therefore, individual cycle time becomes a critical consideration in the operation of a device fabrication foundry. For example, thermal processing may account for about 45% of the total time required to produce a single lot of semiconductor devices.

Consequently, semiconductor fabrication technology has experienced a trend away from batch processing and toward single wafer processing. Single wafer processes have significantly shorter thermal cycle times because they may employ rapid thermal processes (RTP), such as those employing infra-red lamps to quickly heat up a wafer to a process temperature. By replacing batch furnace processes with single wafer processes, product fabrication cycle times can be dramatically reduced. Moreover, single wafer processes allow for greater flexibility in handling complicated product combinations, thereby enabling fabrication facilities to better cater to a customer's needs. Another advantage of single wafer processing is that a much lower loss in product can occur with single wafer processing compared to batch processing, because a large plurality of wafers can be lost in the event of a catastrophic failure during batch processing, whereas only a few or a single wafers can be lost in the event of a catastrophic failure during single wafer processing. Single wafer processing also allows timely investigation for quality, reliability, research and development.

However, problems can arise when replacing batch processes with single wafer processes. For example, employing single wafer processing during the fabrication of spacers conventionally formed on opposing sides of a semiconductor device gate stack can result in excessive current between the gate stack and the device well. Single wafer processing of the spacers can also be deleterious to hot carrier injection performance as compared to batch processing.

Accordingly, what is needed in the art is a semiconductor device and method of manufacturing thereof that addresses the above-discussed issues.

SUMMARY

The present disclosure provides a semiconductor device including a gate stack located over a substrate and a spacer located over the substrate and adjacent the gate stack. The spacer includes a plurality of layers, wherein at least one of the plurality of layers is a batch layer and at least one of the plurality of layers is a non-batch layer.

The present disclosure also introduces a method of fabricating a semiconductor device. In one embodiment, the method includes forming a gate stack over a substrate and forming a spacer over the substrate and adjacent the gate stack. The spacer includes a plurality of layers, wherein at least one of the plurality of layers is a batch layer and at least one of the plurality of layers is a non-batch layer.

An integrated circuit device is also provided by the present disclosure. The integrated circuit device includes a plurality of semiconductor devices each including a gate stack located over a substrate and a spacer located over the substrate and adjacent the gate stack. The spacers each include a plurality of spacer layers, wherein at least one of the plurality of spacer layers is a batch spacer layer and at least one of the plurality of spacer layers is a non-batch spacer layer.

The foregoing has outlined preferred and alternative features of several embodiments so that those skilled in the art may better understand the detailed description that follows. Additional features will be described below that further form the subject of the claims herein. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
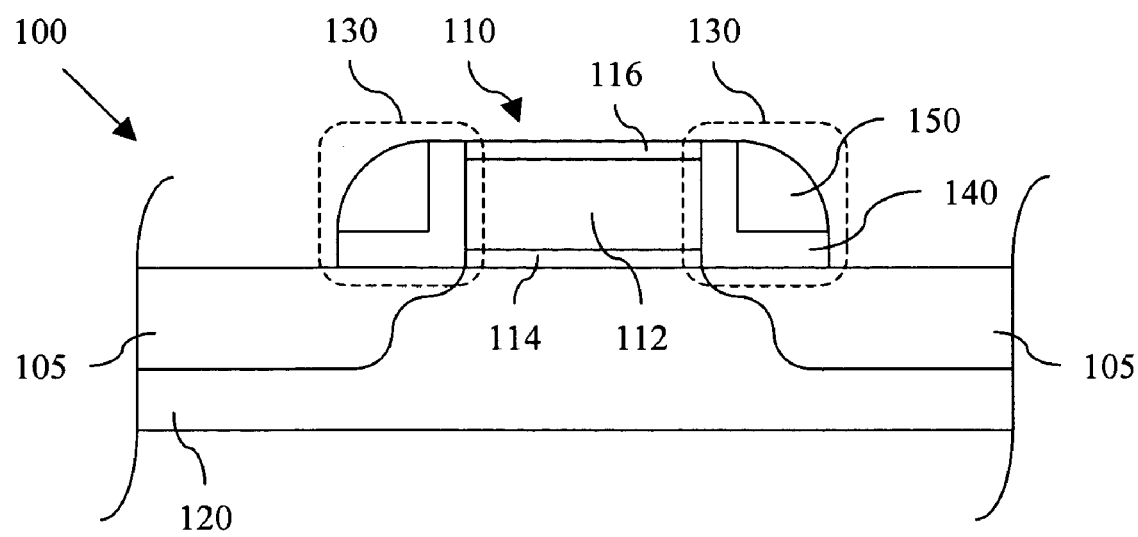
FIG. 1 illustrates a sectional view of one embodiment of a semiconductor device constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of one embodiment of a semiconductor device 100 constructed according to aspects of the present disclosure. The semiconductor device 100 may be a metal-oxide-semiconductor field-effect-transistor (MOSFET) or other conventional or future-developed semiconductor device. The device 100 includes a gate stack 110 formed over a substrate 120. The substrate 120 may comprise silicon or other semiconductor materials, or may be a silicon-on-insulator (SOI) substrate, wherein the insulator may comprise silicon dioxide, silicon carbide, diamond and/or other materials. The substrate 120 may also comprise sapphire, plastic or semiconductor nanomaterial, possibly including doped carbon nano-tubes or doped carbon fullerenes.

The gate stack 110 may include a gate electrode 112 formed over a gate dielectric layer 114. The gate dielectric layer 114 may be formed in a thermal oxidation furnace at a temperature ranging between about 700° C. and about 900° C., or higher, for a period ranging between about 5 seconds and about 60 minutes. The gate dielectric layer 114 may be formed in a batch process, a single wafer process or a combination thereof. For example, a single wafer process may employ rapid thermal processing (RTP) with an in-situ steam generation method or in a supercritical water environment. The gate dielectric layer 114 may also comprise a high-k dielectric material such as $HfO_2$.

The gate electrode 112 may comprise polysilicon and/or other conducitve materials, and may be formed by chemical vapor deposition (CVD), plasma enhanced CVD (PECVD), atomic layer deposition (ALD) and/or other processes. The gate stack 110 may also comprise a cap oxide layer 116 formed over the gate electrode 112. The cap oxide layer 116 may be formed in a thermal oxidation furnace at a temperature ranging between about 700° C. and about 900° C., or higher, for a period of about 60 minutes. The cap oxide layer 116 may also be formed by CVD, PECVD, ALD and/or other processes.

The semiconductor device 100 also includes a spacer 130 formed over the substrate 120 and adjacent the gate stack 110. As shown in the illustrated embodiment, the semiconductor device 100 may also include more than one spacer 130. The spacer 130 includes a first spacer layer 140 formed over the substrate 120 and a second spacer layer 150 formed over the first spacer layer 140.

The first spacer layer 140 may be formed by batch processing, wherein a plurality of wafers are processed simultaneously. For example, the first spacer layer 140 may be formed by depositing tetraethylorthosilicate (TEOS), oxy-nitride-oxide, silicon nitride, diamond and/or other dielectric materials over the substrate 120 in a batch furnace. Such batch furnace deposition may employ a relatively slow temperature ramp, possibly to a temperature ranging between about 600° C. and about 700° C. The process gases employed to form the first spacer layer 140 may be introduced by bubbling, direct liquid injection, liquid mass flow or coriollis force dependent flow control.

The second spacer layer 150 may also be formed by batch processing, and may comprise TEOS, silicon nitride, silicon oxy-nitride, oxy-nitride-oxide, diamond and/or other dielectric materials. In one embodiment, the second spacer layer 150 may be formed in a batch furnace employing a relatively slow temperature ramp, possibly to a temperature ranging between about 600° C. and about 700° C. A mixture of $SiH_4$, $NH_3$, NO, $H_2$ and/or other reactive gases may be introduced into the batch furnace, as well as an inert gas such as $N_2$ and/or Ar. The introduction of $H_2$ may adjust the deposition zone in the batch furnace and may control gas-phase reactions during the deposition of the second spacer layer 150. Introducing NO gas into the batch furnace may reduce stress in the resulting second spacer layer 150, and may also be added in embodiments in which the second spacer layer 150 comprises silicon oxy-nitride. Introducing $NH_3$ into the batch furnace may control the nitrogen content of the second spacer layer 150. The process gases employed to form the second layer 150 may be introduced by bubbling, direct liquid injection, liquid mass flow or coriollis force dependent flow control.

In another embodiment, the first and/or second spacer layers 140, 150 may be formed by single wafer processing. In such embodiments, the single wafer process may deposit or otherwise form TEOS, silicon nitride, silicon oxy-nitride and/or other materials. An anisotropic plasma or dry etch may be performed after the first and second spacer layers 140, 150 have been formed, such as to arrive at the geometry of the spacers 130 shown in FIG. 1, although the scope of the present disclosure is not limited to the illustrated geometry of the spacers 130. In general, the spacers 130 may be employed to protect the sides of the gate stack 110 during subsequent ion implantation and other processing, including during the formation of lightly doped and/or heavily doped source/drain regions 105.

In a preferred embodiment, the first spacer layer 140 is a batch layer and the second spacer layer 140 is a non-batch layer. That is, the first spacer layer 140 is formed by batch processing whereas the second spacer layer 150 is formed by single wafer processing or other non-batch processing. In another embodiment, the first spacer layer 140 is a non-batch layer and the second spacer layer is a batch layer. By employing the multi-layered spacer 130, wherein at least one of the first and second spacer layers 140, 150 is a batch layer and at least one of the first and second spacers layers 140, 150 is a non-batch layer, the performance, reliability and predictability of the device 100 may be improved, as described below.

Figure 2:
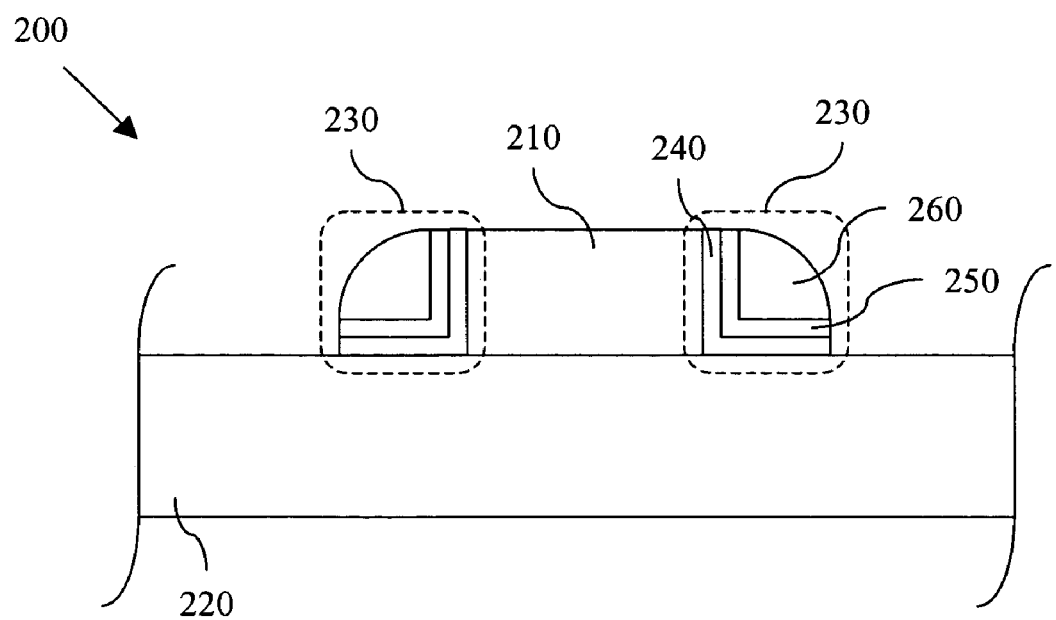
FIG. 2 illustrates a sectional view of another embodiment of a semiconductor device constructed according to aspects of the present disclosure.

Referring to FIG. 2, illustrated is a sectional view of another embodiment of a semiconductor device 200 constructed according to aspects of the present disclosure. The semiconductor device 200 may be substantially similar in composition and manufacture to the semiconductor device 100 of FIG. 1. For example, the semiconductor device 200 includes a gate stack 210 formed over a substrate 220, and also includes spacers 230 formed over the substrate 220 on opposing sides of the gate stack 210. The gate stack 210 and the substrate 220 may be substantially similar to the gate stack 110 and the substrate 120, respectively, shown in FIG. 1. However, the spacers 230 include more than the two spacer layers, in contrast to the first and second spacer layers 140, 150 of the spacers 130 shown in FIG. 1.

In the present embodiment, the spacers 230 include a first spacer layer 240 formed over the substrate 220, a second spacer layer 250 formed over the first spacer layer 240 and a third spacer layer 260 formed over the second spacer layer 250. Each of the spacer layers 240, 250, 260 may be formed by one or more of the processes described above for the formation of the first and second spacer layers 140, 150 of FIG. 1. Moreover, the spacers 230 may include other layers in addition to or as an alternative to the spacer layers 240, 250, 260 shown in FIG. 2.

At least one of the spacer layers 240, 250, 260 is preferably a batch layer (formed in a batch-type process environment) and at least one of the spacer layers 240, 250, 260 is preferably a non-batch layer (formed in a single-wafer-type process environment). For example, the first spacer layer 240 may be a batch layer and the second and third spacer layers 250, 260 may be non-batch layers. In another embodiment, the first and second spacer layers 240, 250 may be non-batch layers and the third spacer layer 260 may be a batch layer. As another example, the first and third spacer layers 240, 260 may be batch layers and the second spacer layer 250 may be a non-batch layer.

By employing the multi-layered spacers 230 having more than two layers, the advantages achieved by employing multi-layered spacers having at least one batch layer and at least one non-batch layer may be coupled with the advantages offered by myriad conventional and future-developed spacer compositions. For example, in one embodiment, the spacers 230 may be ONO spacers, wherein the first spacer layer 240 may comprise an oxide layer formed by batch processing, the second spacer layer 250 may comprise a nitride layer formed by single wafer processing, and the third spacer layer 260 may comprise another oxide layer formed by batch processing.

Figure 3:
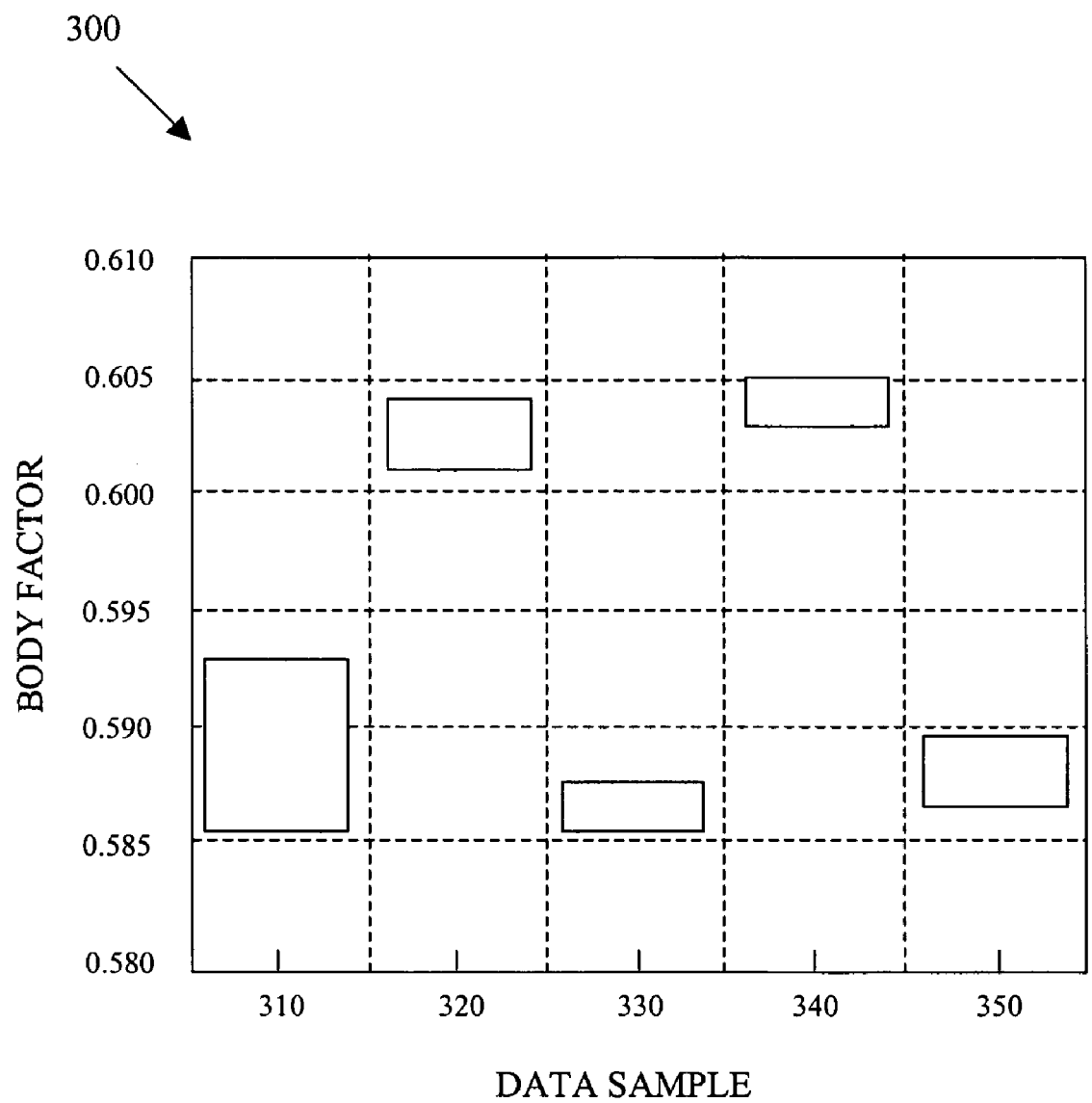
FIG. 3 illustrates a chart comparing body factor characteristics of conventional semiconductor devices with body factor characteristics of embodiments of semiconductor devices constructed according to aspects of the present disclosure.

Referring to FIG. 3, illustrated is a chart 300 comparing the body factor of several conventionally formed semiconductor devices and the body factor of embodiments of semiconductor devices constructed according to aspects of the present disclosure. The body factor can influence the threshold voltage of a transistor and, as such, is one parameter employed as an input variable for semiconductor device and circuit simulation software such as SPICE, developed by Intusoft of Gardena, Calif. The body factor is a parameter that may be important when addressing substrate bias effects in transistors. In one embodiment, the body factor can be expressed as:

$$\gamma = \frac{\sqrt{\varepsilon_s q N_A}}{C_{ox}}$$

where $\varepsilon_s$ is the relative dielectric constant, q is the charge, $N_A$ is the acceptor concentration (e.g., the dopant concentration of a channel), and $C_{OX}$ is the gate capacitance per unit area. Therefore, since the threshold voltage may be defined as:

$$V_{T,inv} = -\Phi_B + \gamma \sqrt{-V_{BS} - 2\Phi_B}$$

where $\Phi_B$ is the built-in potential and $V_{BS}$ is the bias voltage, the body factor can increase the dependence of a transistor threshold voltage on $\Phi_B$ and $V_{BS}$. Moreover, the body factor can be an indication of the electrical operational stability of a transistor.

A first data sample 310 in the chart 300 represents a semiconductor device having multi-layered ONO spacers, wherein each of the three spacer layers are batch layers. The first data sample 310 demonstrates that the body factor for such an embodiment ranges between about 0.586 and about 0.593.

A data sample 320 represents a semiconductor device having multi-layered ONO spacers, wherein each of the three spacer layers are non-batch layers. The data sample 320 demonstrates that the body factor for such an embodiment ranges between about 0.601 and about 0.604.

A data sample 330 represents a semiconductor device having multi-layered ONO spacers, wherein the first oxide layer is a batch layer and the nitride and second oxide layers are non-batch layers. The data sample 330 demonstrates that the body factor for such an embodiment ranges between about 0.586 and about 0.588.

A data sample 340 represents a semiconductor device having multi-layered ONO spacers, wherein the first oxide and the nitride layers are non-batch layers and the second oxide layer is a batch layer. The data sample 340 demonstrates that the body factor for such an embodiment ranges between about 0.603 and about 0.605.

A data sample 350 represents a semiconductor device having multi-layered ONO spacers, wherein each of the three spacer layers are non-batch layers that are formed by non-batch processing and subsequently annealed in a batch furnace. The data sample 350 demonstrates that the body factor for such an embodiment ranges between about 0.587 and about 0.590.

Because the body factor is an indication of the dependence on a transistor threshold voltage on built-in potential and bias voltage, it is preferable that the range of variation of body factor is minimized. Thus, the embodiments represented by the data samples 330, 340 are preferable to the embodiment represented by the data sample 310, because the range of the data sample 310 is three times the range of each of the data samples 330, 340. Therefore, the chart 300 demonstrates a significant advantage when spacers are formed by a combination of single wafer processes and batch furnace processes. That is, minimums in the distribution range for the body factor data samples 330 and 340 illustrate that implementing the combination of single wafer processes and batch processes provides greater control and stability of transistor threshold voltage.

Figure 4:
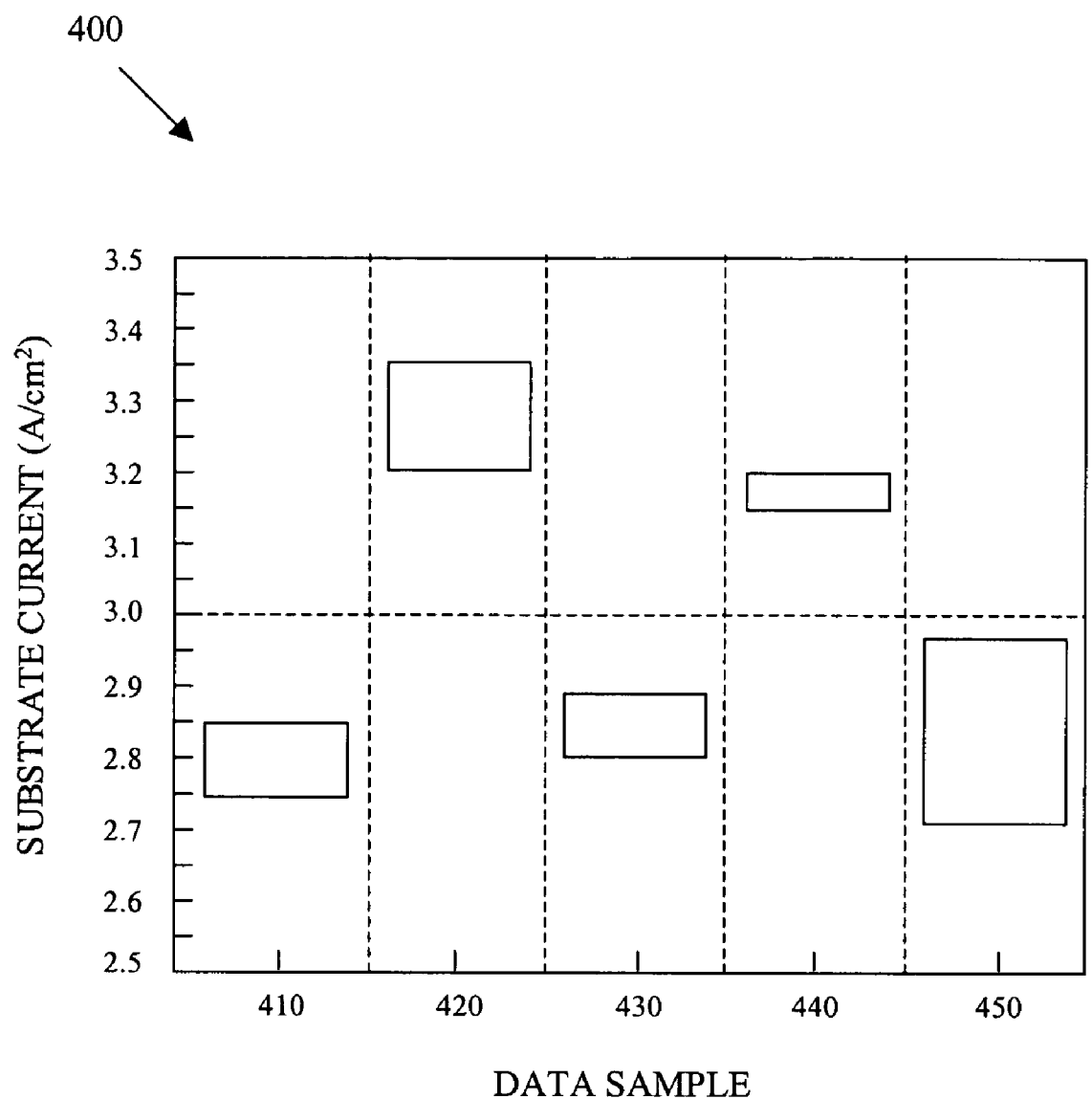
FIG. 4 illustrates a comparing substrate current levels of conventional semiconductor devices with substrate current levels of embodiments of semiconductor devices constructed according to aspects of the present disclosure.

Referring to FIG. 4, illustrated is a chart 400 comparing the substrate current of several conventionally formed semiconductor devices and the substrate current of embodiments of semiconductor devices constructed according to aspects of the present disclosure. The substrate current can relate to the reliability and hot carrier injection (HCI) of MOSFETs and other transistor devices. The shorter a gate channel width becomes the greater the chance that a maximum substrate current can be observed. An increase in substrate current indicates a degradation in the gate dielectric layer of a transistor device, such that substrate current may also provide a measurement of transistor reliability.

A first data sample 410 in the chart 400 represents a semiconductor device having multi-layered ONO spacers, wherein each of the three spacer layers are batch layers. The first data sample 410 demonstrates that the substrate current for such an embodiment ranges between about 2.75 A/cm$^2$ and about 2.85 A/cm$^2$.

A data sample 420 represents a semiconductor device having multi-layered ONO spacers, wherein each of the three spacer layers are non-batch layers. The data sample 420 demonstrates that the substrate current for such an embodiment ranges between about 3.20 A/cm$^2$ and about 3.35 A/cm$^2$.

A data sample 430 represents a semiconductor device having multi-layered ONO spacers, wherein each of the three spacer layers are non-batch layers. The data sample 430 demonstrates that the substrate current for such an embodiment ranges between about 2.80 A/cm$^2$ and about 2.90 A/cm$^2$.

A data sample 440 represents a semiconductor device having multi-layered ONO spacers, wherein each of the three spacer layers are non-batch layers. The data sample 440 demonstrates that the substrate current for such an embodiment ranges between about 3.15 A/cm$^2$ and about 3.20 A/cm$^2$.

A data sample 450 represents a semiconductor device having multi-layered ONO spacers, wherein each of the three spacer layers are non-batch layers. The data sample 450 demonstrates that the substrate current for such an embodiment ranges between about 2.75 A/cm$^2$ and about 2.95 A/cm$^2$.

Therefore, according to FIG. 4, embodiments incorporating a multi-layered spacer having at least one batch layer and at least one non-batch layer may demonstrate improved control of transistor reliability as compared to embodiments incorporating multi-layered spacers having all layers formed by single wafer processes. Data samples 430 and 440 illustrate minimums in the distribution range for the substrate current, therefore illustrating increased control of transistor reliability by utilizing batch layer processing in combination with single wafer processing compared to the data sample 420 representing a device having a spacer formed by only single wafer processing.

Figure 5:
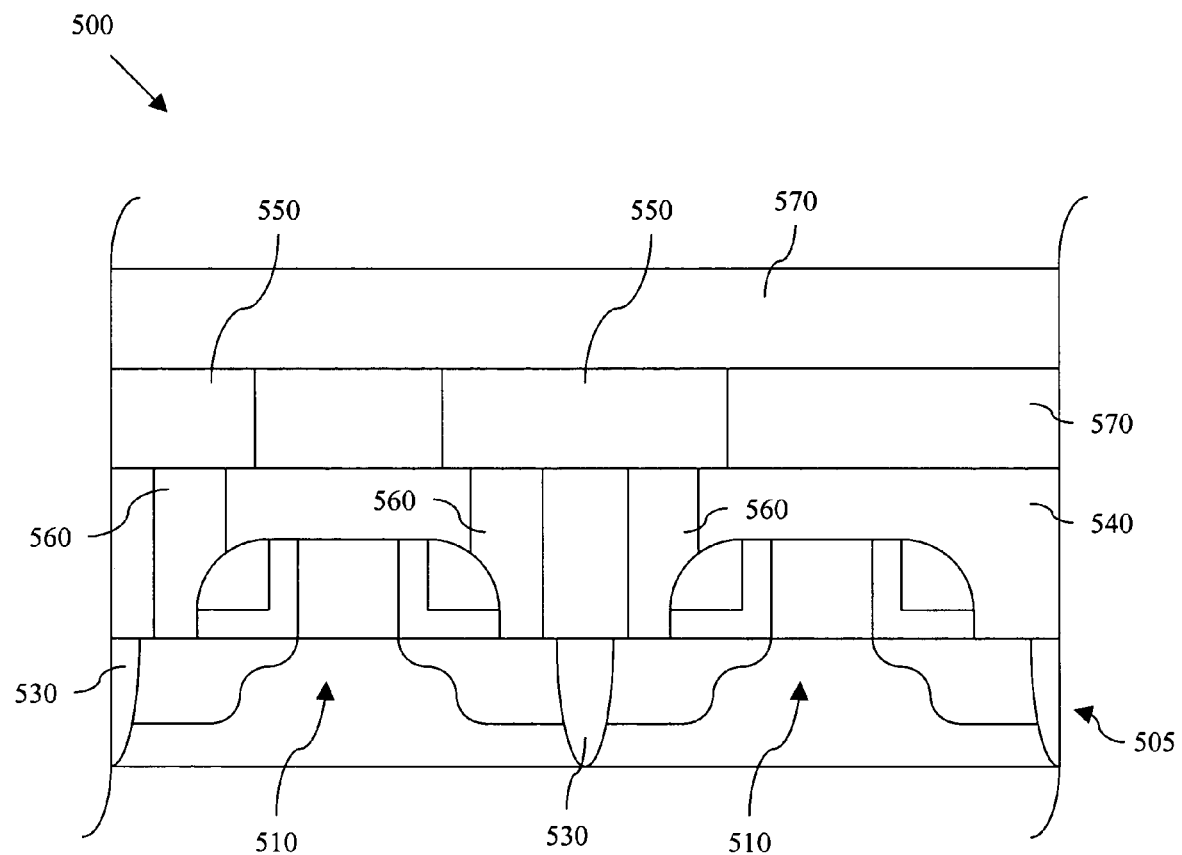
FIG. 5 illustrates a sectional view of one embodiment of an integrated circuit device constructed according to aspects of the present disclosure.

Referring to FIG. 5, illustrated is a sectional view of one embodiment of an integrated circuit device 500 constructed according to aspects of the present disclosure. The integrated circuit device 500 is one environment in which the semiconductor device 100 of FIG. 1 and/or the semiconductor device 200 of FIG. 2 may be implemented. For example, in the illustrated embodiment, the integrated circuit device 500 includes a plurality of semiconductor devices 510 which may each be similar in composition and manufacture to the semiconductor device 100 of FIG. 1. The substrate 505 may be similar in composition and manufacture to the substrate 120 of FIG. 1. The substrate 505 may also include isolation regions 530, which may be field oxide regions or shallow trench isolation regions.

The integrated circuit device 500 may also include a dielectric layer 540 formed by single wafer processing and/or batch processing over the semiconductor devices 510 and the substrate 505. The dielectric layer 540 may comprise TEOS, low-k material, diamond, and/or other materials, and may include pockets or bubbles filled with an inert gas or air.

The integrated circuit device 500 also includes a plurality of interconnects 550 that interconnect ones of the semiconductor devices 510, possibly via corresponding ones of a plurality of contacts 560 extending through the dielectric layer 540. The interconnects 550 and contacts 560 may be formed by single wafer processing and/or batch layer processing. For example, the interconnects 550 may be formed by single wafer processes for metal deposition, such as ALD, CVD and/or physical vapor deposition, in combination with one or more batch layer processes, such as chemical mechanical polishing. The integrated circuit device 500 may also include one or more interlevel dielectric layers 570 formed by batch and/or single wafer processes over the dielectric layer 540 and/or the interconnects 550

Although embodiments of the present disclosure have been described in detail, those skilled in the art should understand that they can make various changes, substitutions and alterations herein without departing from the spirit and scope of the present disclosure.

What is claimed is:

1. A semiconductor device, comprising:
 a gate stack located over a substrate; and
 a spacer located over the substrate and adjacent the gate stack and including a plurality of layers, wherein:
  at least one of the plurality of layers is a batch layer; and
  at least one of the plurality of layers is a non-batch layer.

2. The device of claim 1 wherein the batch layer comprises an oxide-forming organic precursor.

3. The device of claim 1 wherein the batch layer comprises TEOS.

4. The device of claim 1 wherein the batch layer comprises silicon nitride.

5. The device of claim 1 wherein the batch layer comprises oxy-nitride-oxide.

6. The device of claim 1 wherein the batch layer interposes the substrate and a remaining one of the plurality of layers.

7. The device of claim 1 wherein the batch layer is opposite a remaining one of the plurality of layers from the substrate.

8. The device of claim 1 wherein the plurality of layers includes a first layer located over the substrate, a second layer located over the first layer and a third layer located over the second layer, wherein the first layer is the batch layer.

9. The device of claim 1 wherein the plurality of layers includes a first layer located over the substrate, a second layer located over the first layer and a third layer located over the second layer, wherein the third layer is the batch layer.

10. An integrated circuit device, comprising:
 a plurality of semiconductor devices each including:
  a gate stack located over a substrate; and
  a spacer located over the substrate and adjacent the gate stack and including a plurality of spacer layers, wherein:
   at least one of the plurality of spacer layers is a batch spacer layer; and
   at least one of the plurality of spacer layers is a non-batch spacer layer; and
 a plurality of interconnects located over the substrate and interconnecting ones of the plurality of semiconductor devices.

11. The device of claim 10 further comprising a plurality of interlevel dielectric layers located over the plurality of semiconductor devices, wherein:
 at least one of the plurality of interlevel dielectric layers is an interlevel dielectric batch layer; and
 at least one of the plurality of interlevel dielectric layers is an interlevel dielectric non-batch layer.

12. The device of claim 10 wherein the plurality of spacer layers includes a first spacer layer located over the substrate, a second spacer layer located over the first spacer layer and a third spacer layer located over the second spacer layer, wherein the first spacer layer is the batch spacer layer.

13. The device of claim 10 wherein the plurality of spacer layers includes a first spacer layer located over the substrate, a second spacer layer located over the first spacer layer and a third spacer layer located over the second spacer layer, wherein the third spacer layer is the batch spacer layer.

14. The device of claim 10 wherein the batch spacer layer comprises TEOS.

15. The device of claim 14 wherein the non-batch spacer layer comprises nitride.

16. The device of claim 10 wherein at least one of the plurality of spacer layers comprises diamond.

17. The device of claim 10 wherein the batch spacer layer comprises an oxide-forming organic precursor.

18. The device of claim 10 wherein the batch spacer layer comprises silicon nitride.

19. The device of claim 10 wherein the batch spacer layer comprises oxy-nitride-oxide.

20. The device of claim 10 wherein the batch spacer layer interposes the substrate and a remaining one of the plurality of layers.

21. The device of claim 10 wherein the batch spacer layer is opposite a remaining one of the plurality of layers from the substrate.

* * * * *